United States Patent
Kanitz et al.

(10) Patent No.: US 9,806,266 B2
(45) Date of Patent: Oct. 31, 2017

(54) SALTS OF PHOSPHORUS OXIDE AS N-DOPANTS FOR ORGANIC ELECTRONICS

(71) Applicant: SIEMENS AKTIENGESELLSCHAFT, München (DE)

(72) Inventors: Andreas Kanitz, Hoechstadt (DE); Günter Schmid, Hemhofen (DE); Jan Hauke Wemken, Nuremberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 232 days.

(21) Appl. No.: 14/431,238

(22) PCT Filed: Sep. 11, 2013

(86) PCT No.: PCT/EP2013/068826
§ 371 (c)(1),
(2) Date: Mar. 25, 2015

(87) PCT Pub. No.: WO2014/048753
PCT Pub. Date: Apr. 3, 2014

(65) Prior Publication Data
US 2015/0255719 A1  Sep. 10, 2015

(30) Foreign Application Priority Data
Sep. 27, 2012  (DE) .......... 10 2012 217 574

(51) Int. Cl.
*H01L 51/30* (2006.01)
*H01L 51/00* (2006.01)
(Continued)

(52) U.S. Cl.
CPC .......... *H01L 51/005* (2013.01); *H01L 51/002* (2013.01); *H01L 51/0022* (2013.01);
(Continued)

(58) Field of Classification Search
CPC . H01L 51/005; H01L 51/5076; H01L 51/002; H01L 51/0545; H01L 51/56;
(Continued)

(56) References Cited

U.S. PATENT DOCUMENTS 5,965,281 A * 10/1999 Cao ............. H01L 51/0038
257/40
6,284,435 B1 * 9/2001 Cao ............. H01L 51/0038
252/500

(Continued)

FOREIGN PATENT DOCUMENTS

| CN | 101405888 A | 4/2009 | ............. H01L 51/50 |
| CN | 102576823 A | 7/2012 | ............. H01L 51/30 |

(Continued)

OTHER PUBLICATIONS

Maia et al., Photoelectrochemical Measurements of Polyaniline Growth in a Layered Material, Electrochimica Acta, pp. 1945-1952 (1999).*

(Continued)

*Primary Examiner* — Jayne Mershon
(74) *Attorney, Agent, or Firm* — Slayden Grubert Beard PLLC

(57) ABSTRACT

An organic electronic component contains a substrate, a first electrode, a second electrode and at least one electron transport layer between the first and second electrode. The electron transport layer is a salt-like derivative of a phosphorus oxo compound as n-dopant.

5 Claims, 1 Drawing Sheet

(51) Int. Cl.
  *H01L 51/05* (2006.01)
  *H01L 51/44* (2006.01)
  *H01L 51/50* (2006.01)
  *H01L 51/52* (2006.01)
  *H01L 51/56* (2006.01)

(52) U.S. Cl.
  CPC ...... *H01L 51/0545* (2013.01); *H01L 51/0558* (2013.01); *H01L 51/441* (2013.01); *H01L 51/5076* (2013.01); *H01L 51/5203* (2013.01); *H01L 51/56* (2013.01); *H01L 2251/558* (2013.01); *Y02E 10/549* (2013.01); *Y02P 70/521* (2015.11)

(58) Field of Classification Search
  CPC . H01L 51/441; H01L 51/0558; H01L 51/558; H01L 51/5203; H01L 51/0022
  USPC .......................................... 136/263
  See application file for complete search history.

(56) References Cited

U.S. PATENT DOCUMENTS

| | | | |
|---|---|---|---|
| 7,800,297 | B2 | 9/2010 | Reddy ........................... 313/504 |
| 2012/0286253 | A1 | 11/2012 | Schmid et al. ................. 257/40 |

FOREIGN PATENT DOCUMENTS

| | | |
|---|---|---|
| DE | 112007000924 T5 | 9/2009 |
| DE | 102010031897 A1 | 1/2012 |
| DE | 102012217574.1 | 9/2012 |
| JP | 2004-335137 | 11/2004 |
| WO | 2011/039323 A2 | 4/2011 |

OTHER PUBLICATIONS

German OA for Application 102012217574.1 dated May 21, 2013.
Int'l Search Report for PCT/EP2013/068826 dated Nov. 12, 2013.
J. Huang et al., "Low-Work-Function Surface Formed by Solution-Processed and Thermally Deposited Nanoscale Layers of Cesium Carbonate", Advanced Functional Materials, 2007, pp. 1-8.
C.-I. Wu et al., "Electronic structures and electron-injection mechanisms of cesium-carbonate-incorporated cathode structures for organic light-emitting devices", Applied Physics Letters, 2006, vol. 88, pp. 152104-1 to 152104-3.
T. Xiong et al., "Cesium hydroxide doped tris-(8-hydroxyquinoline) aluminum as an effective electron injection layer in inverted bottom-emission organic light emitting diodes", Applied Physics Letters, 2008, vol. 92, pp. 263305-1 to 263305-3.
M.H. Ho et al., "Electrical characterization of organic light-emitting diodes using dipotassium phthalate as n-type dopant"; Applied Physics Letters, 2008, vol. 93, pp. 083505-1 to 083505-3.
G. Schmid et al., "Structure Property Relationship of Salt-based n-Dopants in Organic Light Emitting Diodes", Organic Electronic Conference 2007, Sep. 2007, pp. 1-21.
M.-H. Ho et al., "Highly efficient *p-i-n* white organic light emitting devices with tandem structure", Applied Physics Letters, 2007, vol. 91, pp. 233507-1 to 233507-3.
J. H. Wemken et al., "Low-cost caesium phosphate as n-dopant for organic lightemitting diodes", Journal of Applied Physics, Dec. 2012 , vol. 111, pp. 074502-1 to 074502-5, printed from dx.doi.org/10.1063/1.3699008 on May 16, 2013.
C. Diez et al., "Highly stable charge generation layers using caesium phosphate as n-dopants and inserting interlayers", Journal of Applied Physics, May 2012, vol. 111; pp. 103107-1 to 103107-7, printed from dx.doi.org/10.1063/1.4720064 on May 16, 2013.
Bouhafs, D. et al., "Influence of the Organic Solvents on the Properties of the Phosphoric Acid Dopant Emulsion Deposited on Multicrystalline," Journal of Physics D: Applied Physics, vol. 40, pp. 2728-2731 (4 pages), Apr. 19, 2007.
Chinese Office Action, Application No. 201380050032.6, 14 pages, Aug. 19, 2016.
Korean Office Action, Application No. 20157010345, 13 pages, Feb. 16, 2017.
Chinese Office Action, Application No. 201380050032.6, 15 pages, Apr. 6, 2017.

* cited by examiner

SALTS OF PHOSPHORUS OXIDE AS N-DOPANTS FOR ORGANIC ELECTRONICS

CROSS REFERENCE TO RELATED APPLICATIONS

This application is the U.S. national stage of International Application No. PCT/EP2013/068826, filed Sep. 11, 2013 and claims the benefit thereof. The International Application claims the benefit of German Application No. 102012217574.1 filed on Sep. 27, 2012, both applications are incorporated by reference herein in their entirety.

BACKGROUND

Described below is an organic electronic component having a substrate, a first electrode, a second electrode and at least one electron-conducting layer disposed between the first and second electrodes. The electron-conducting layer includes a salt-type derivative of a phosphorus oxo compound as n-dopant. This layer sequence may be embedded into a complex component, for example an OLED.

The fact that the electron conductivity of organic layers can be enhanced by general doping with extraneous substances is sufficiently well known. If the compounds which are to be used as dopants exhibit a suitable HOMO/LUMO (highest occupied molecular orbital/lowest unoccupied molecular orbital) in relation to the organic matrix, an electron may be transferred from the dopant to the matrix, resulting in a consequential rise in the charge carrier density and hence generally in the conductivity of the organic, electrically conductive layer. This mechanism generally forms one of the fundamentals of the setup and for optimization of organic electronic components.

Depending on their functionality, the abovementioned organic components can be divided into groups capable of
- converting light to electrical current, for example organic solar cells having a structure as shown in schematic form in FIG. 1,
- generating light from electrical current, for example organic light-emitting diodes having a structure as shown schematically in FIG. 2, and
- controlling electrical current, for example organic field-effect transistors having a structure as shown schematically in FIG. 3.

A common factor to all the component classes is that the quality of the components results essentially from the charge carrier density and mobility of the organic layers used.

There are basically two different methods used in organic electronics to increase electron conductivity. Firstly, an increase in the charge carrier mobility can be achieved by the insertion of an intermediate layer between the cathode and electron transport layer. Secondly, n-doping of electrically conductive organic matrix materials with donors of different strength is the second option.

For the former method, often thin salt layers which lower the work function of the electrons, composed of LiF, CsF or, in the more recent literature, cesium carbonate, are used. The properties and effects of cesium carbonate are described, for example, by Huang, Jinsong et al., Adv. Funct. Mater. 2007, 00, 1-8; Wu, Chih-I et al., APPLIED PHYSICS LETTERS 88, 152104 (2006) and Xiong, Tao et al., APPLIED PHYSICS LETTERS 92, 263305 (2008). These intermediate layers significantly improve electron transport, but this improvement is inadequate for high-efficiency components.

For doping of electronic transport layers, in contrast, it is generally the case that substances having a HOMO (highest occupied molecular orbital) above the LUMO (lowest unoccupied molecular orbital) of the matrix material are used. This is a prerequisite for transfer of an electron from the dopant to the matrix material and thus for an increase in its conductivity. In addition, it is desirable to introduce substances whose valence electrons have very low work functions or ionization energies. This too can facilitate the electron release of the dopant and increase the layer conductivity.

The literature cites successful dopants containing alkali metals and alkaline earth metals or lanthanoids as cations. For example, the use of dipotassium phthalate is described by Meng-Huan Ho et al. (Applied Physics Letters 93, 083505, 2008). Other approaches, as pursued, for example, by Schmid et al. (Organic Electronic Conference; Sep. 24-26, 2007, Frankfurt, Germany) and Meng-Huan Hoa et al. (Applied Physics Letters 91, 233507; 2007), are concerned with the use of cesium carbonate for doping of electron conductors in OLEDs. The latter found that the improvements in the conductivity of the matrix layer achievable through cesium salt doping are essentially a function of the anion of the evaporated salt. In addition, it was shown that the anion exerts a relatively small influence on the evaporability of the compound as such. This evaporation temperature is of course an important parameter in the processibility of the compound and, for energetic reasons, a high evaporation temperature in the process regime is disadvantageous.

A high evaporation temperature is also disadvantageous in the use of cesium phosphate as dopant, as disclosed, for example, in WO 2011 039323 A2. Although it is possible to obtain very good n-conductivities of organic layers through doping with this salt, it is necessary to work with high sublimation temperatures because of the salt-type character of the dopant, which makes the doping difficult in terms of process technology.

SUMMARY

Described below is an organic electronic component which has improved properties compared to the prior art and can be produced in a simple and inexpensive manner. In addition, a route to production thereof is described.

BRIEF DESCRIPTION OF THE DRAWINGS

These and other aspects and advantages will become more apparent and more readily appreciated from the following description of the exemplary embodiments, taken in conjunction with the accompanying drawings of which.

DETAILED DESCRIPTION OF THE PREFERRED EMBODIMENT

Figure 1:
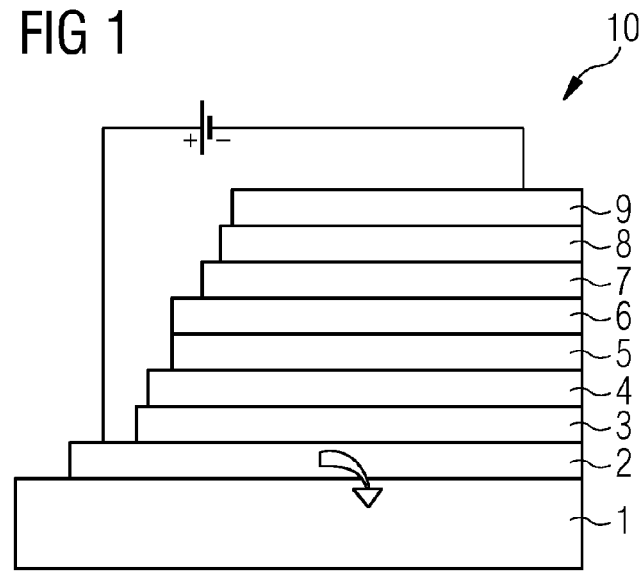
FIG. 1 a schematic of the structure of an organic light-emitting diode.

Reference will now be made in detail to the preferred embodiments, examples of which are illustrated in the accompanying drawings, wherein like reference numerals refer to like elements throughout.

The organic electronic component has a substrate, a first electrode, a second electrode and at least one electron-conducting layer disposed between the first and second electrodes, where the electron-conducting layer includes a salt-type derivative of a phosphorus oxo compound of the general formula 1 as n-dopant

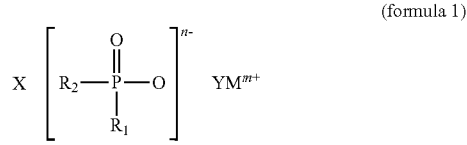

(formula 1)

where X, Y are greater than 0 and less than or equal to 3; n, m are integers and are greater than or equal to 1 and less than or equal to 3; M=metal and $R_1$=O, S, Se, O—R, S—R, Se—R and R2=R, O—R, S—R, Se—R, and R is selected from the group of substituted and unsubstituted alkyl, long-chain alkyl, cycloalkyl, haloalkyl, aryl, arylene, haloaryl, heteroaryl, heteroarylene, heterocycloalkylene, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl. It has been found that, surprisingly, organic electronic components with electron-conducting layers containing, as constituents, salt-type derivatives of a phosphorus oxo compound of the formula 1 as n-dopants have improved electronic properties and can be evaporated in a simpler and less expensive manner. Especially the use of salt-type derivatives of phosphorus oxo compounds as n-dopants leads to a significant increase in the electrical conductivity of the electron-conducting layer. In addition, the use of the salt-type phosphorus oxo derivatives compared to the dopants known from the prior art achieves a lowering in sublimation temperature of these compounds, which has a positive effect on the total energy requirement of the preparation and the homogeneity of the layers obtained.

Without being bound by the theory, the lowering of the sublimation temperature of the dopant results from the derivatization of the salt-type phosphorus oxo compounds. The derivatization increases the molecular mass of the phosphorus oxo compound and would thus contribute in principle to a rise in the evaporation temperature. However, since the evaporation is that of a salt-type compound, the ionic interactions between the anions and cations are very probably weakened by the steric effect of the organic substituents to such an extent that there is an overall reduction in the ionic interactions between anion and cation compared to the underivatized compounds. The separation energy of the anions and cations is thus lowered. As a consequence of this, the derivatized compound can be evaporated more easily in spite of a higher molecular weight.

The derivatization of the dopant can be described in formal terms by the substitution of one or two oxygen atoms in a phosphoric acid salt. The resultant phosphorus oxo compound forms the anion of the salt-type compound and may bear a singly or doubly negative charge n.

The stoichiometric coefficients X, Y of the anion and the cation need not be integers and may be greater than 0 and less than or equal to 3. Non-integer stoichiometric coefficients of the anion or the cation mean that one anion or one cation is coordinated to a plurality of other counterions. It is generally the case that the product of the stoichiometric coefficient and the charge of the anion is equal to the product of the stoichiometric coefficient and the charge of the cation. The charge coefficients n and m of the anion and the cation may only assume positive integer values. The charge of the anion is then found to be the negative value of the charge coefficient n, and the charge of the cation to be the positive value of the charge coefficient m.

The anion contains the two substituents $R_1$ and $R_2$, where $R_1$ is selected from the group of O, S, Se, O—R, S—R, Se—R. The substituent R, in contrast, is selected from the group of substituted and unsubstituted alkyl, long-chain alkyl, cycloalkyl, haloalkyl, aryl, arylene, haloaryl, heteroaryl, heteroarylene, heterocycloalkylene, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl. By this definition, $R_1$ may represent either only one oxygen, sulfur or selenium atom bonded to the phosphorus or else more complex organic compounds in which the oxygen, sulfur or selenium atom additionally bears one of the above-specified organic radicals.

The substituent $R_2$, in contrast, is defined herein as R, O—R, S—R, Se—R, where R is selected from the group of substituted and unsubstituted alkyl, long-chain alkyl, cycloalkyl, haloalkyl, aryl, arylene, haloaryl, heteroaryl, heteroarylene, heterocycloalkylene, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl.

The stoichiometric coefficients X, Y of the anion and the cation need not be integers and may be greater than 0 and less than or equal to 3. Non-integer stoichiometric coefficients of the anion or the cation mean that one anion or one cation is coordinated to a plurality of other counterions. It is generally the case that the product of the stoichiometric coefficient and the charge of the anion is equal to the product of the stoichiometric coefficient and the charge of the cation. The charge coefficients n and m of the anion and the cation may only assume positive integer values. The charge of the anion is then found to be the negative value of the charge coefficient n, and the charge of the cation to be the positive value of the charge coefficient m.

The anion contains the two substituents $R_1$ and $R_2$, where $R_1$ is selected from the group of O, S, Se, O—R, S—R, Se—R. The substituent R, in contrast, is selected from the group of substituted and unsubstituted alkyl, long-chain alkyl, cycloalkyl, haloalkyl, aryl, arylene, haloaryl, heteroaryl, heteroarylene, heterocycloalkylene, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl. By this definition, $R_1$ may represent either only one oxygen, sulfur or selenium atom bonded to the phosphorus or else more complex organic compounds in which the oxygen, sulfur or selenium atom additionally bears one of the above-specified organic radicals.

The substituent $R_2$, in contrast, is defined herein as R, O—R, S—R, Se—R, where R is selected from the group of substituted and unsubstituted alkyl, long-chain alkyl, cycloalkyl, haloalkyl, aryl, arylene, haloaryl, heteroaryl, heteroarylene, heterocycloalkylene, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl.

$R_2$ may accordingly be an organic radical R bonded directly to the phosphorus, or an organic radical R bonded to the phosphorus via an oxygen, sulfur or selenium atom.

Both substituents $R_1$ and $R_2$ may be chosen independently, and a compound in which $R_1$=$R_2$=oxygen is not in accordance with the invention.

Within this application, general groups, for example alkyl, alkoxy, aryl, etc., are referenced. Unless stated otherwise, preference is given to using the following groups among the groups described in general in the context of the present invention:

alkyl: linear and branched C1-C8-alkyls,
long-chain alkyls: linear and branched C5-C20 alkyls
alkenyl: C2-C6-alkenyl,
cycloalkyl: C3-C8-cycloalkyl,
alkylene: selected from the group:
methylene; 1,1-ethylene; 1,2-ethylene; 1,1-propylidene; 1,2-propylene; 1,3-propylene; 2,2-propylidene; butan-2-ol-1,4-diyl; propan-2-ol-1,3-diyl; 1,4-butylene; cyclohexane-1,1-diyl; cyclohexane-1,2-diyl; cyclohexane-1,3-diyl; cyclohexane-1,4-diyl; cyclopentane-1,1-diyl; cyclopentane-1,2-diyl; and cyclopentane-1,3-diyl,
aryl: selected from aromatics having a molecular weight below 300 Da.
arylene: selected from the group: 1,2-phenylene; 1,3-phenylene; 1,4-phenylene; 1,2-naphthylene; 1,3-naphthalenylene; 1,4-naphthylene; 2,3-naphthylene; 1-hydroxy-2,3-phenylene; 1-hydroxy-2,4-phenylene; 1-hydroxy-2,5-phenylene; and 1-hydroxy-2,6-phenylene,
heteroaryl: selected from the group: pyridinyl; pyrimidinyl; pyrazinyl; triazolyl; pyridazinyl; 1,3,5-triazinyl; quinoninyl; isoquinoninyl; quinoxalinyl; imidazolyl; pyrazolyl; benzimidazolyl; thiazolyl; oxazolidinyl; pyrrolyl; thiophenyl; carbazolyl; indolyl; and isoindolyl, where the heteroaryl may be bonded to the compound via any atom in the ring of the selected heteroaryl,
heteroarylene: selected from the group: pyridinediyl; quinolinediyl; pyrazodiyl; pyrazolediyl; triazolediyl; pyrazinediyl, thiophenediyl; and imidazolediyl, where the heteroarylene functions as a bridge in the compound via any desired atom in the ring of the selected heteroaryl; especially pyridine-2,3-diyl; pyridine-2,4-diyl; pyridine-2,5-diyl; pyridine-2,6-diyl; pyridine-3,4-diyl; pyridine-3,5-diyl; quinoline-2,3-diyl; quinoline-2,4-diyl; quinoline-2,8-diyl; isoquinoline-1,3-diyl; isoquinoline-1,4-diyl; pyrazole-1,3-diyl; pyrazole-3,5-diyl; triazole-3,5-diyl; triazole-1,3-diyl; pyrazine-2,5-diyl; and imidazole-2,4-diyl, thiophene-2,5-diyl, thiophene-3,5-diyl; a —C1—C6-heterocycloalkyl selected from the group: piperidinyl; piperidine; 1,4-piperazine, tetrahydrothiophene; tetrahydrofuran; 1,4,7-triazacyclononane; 1,4,8,11-tetraazacyclotetradecane; 1,4,7,10,13-pentaazacyclopentadecane; 1,4-diaza-7-thiacyclononane; 1,4-diaza-7-oxacyclononane; 1,4,7,10-tetraazacyclododecane; 1,4-dioxane; 1,4,7-trithiacyclononane; pyrrolidine; and tetrahydropyran, where the heteroaryl may be bonded to the C1—C6-alkyl via any atom in the ring of the selected heteroaryl,
heterocycloalkylene: selected from the group: piperidin-1,2-ylene; piperidin-2,6-ylene; piperidin-4,4-ylidene; 1,4-piperazin-1,4-ylene; 1,4-piperazin-2,3-ylene; 1,4-piperazin-2,5-ylene; 1,4-piperazin-2,6-ylene; 1,4-piperazin-1,2-ylene; 1,4-piperazin-1,3-ylene; 1,4-piperazin-1,4-ylene; tetrahydrothiophen-2,5-ylene; tetrahydrothiophen-3,4-ylene; tetrahydrothiophen-2,3-ylene; tetrahydrofuran-2,5-ylene; tetrahydrofuran-3,4-ylene; tetrahydrofuran-2,3-ylene; pyrrolidin-2,5-ylene; pyrrolidin-3,4-ylene; pyrrolidin-2,3-ylene; pyrrolidin-1,2-ylene; pyrrolidin-1,3-ylene; pyrrolidin-2,2-ylidene; 1,4,7-triazacyclonon-1,4-ylene; 1,4,7-triaza-cyclonon-2,3-ylene; 1,4,7-triazacyclonon-2,9-ylene; 1,4,7-triazacyclonon-3,8-ylene; 1,4,7-triazacyclonon-2,2-ylidene; 1,4,8,11-tetraazacyclotetradec-1,4-ylene; 1,4,8,11-tetraaza-cyclotetradec-1,8-ylene; 1,4,8,11-tetraazacyclotetradec-2,3-ylene; 1,4,8,11-tetraazacyclotetradec-2,5-ylene; 1,4,8,11-tetraazacyclotetradec-1,2-ylene; 1,4,8,11-tetraazacyclotetradec-2,2-ylidene; 1,4,7,10-tetraazacyclododec-1,4-ylene; 1,4,7,10-tetraazacyclododec-1,7-ylene; 1,4,7,10-tetraazacyclododec-1,2-ylene; 1,4,7,10-tetraazacyclododec-2,3-ylene; 1,4,7,10-tetraazacyclododec-2,2-ylidene; 1,4,7,10,13-pentaaza-cyclopentadec-1,4-ylene; 1,4,7,10,13-pentaazacyclopentadec-1,7-ylene; 1,4,7,10,13-pentaazacyclopentadec-2,3-ylene; 1,4,7,10,13-pentaazacyclopentadec-1,2-ylene; 1,4,7,10,13-pentaazacyclopentadec-2,2-ylidene; 1,4-diaza-7-thiacyclonon-1,4-ylene; 1,4-diaza-7-thiacyclonon-1,2-ylene; 1,4-diaza-7-thiacyclonon-2,3-ylene; 1,4-diaza-7-thiacyclonon-6,8-ylene; 1,4-diaza-7-thiacyclonon-2,2-ylidene; 1,4-diaza-7-oxacyclonon-1,4-ylene; 1,4-diaza-7-oxacyclonon-1,2-ylene; 1,4-diaza-7-oxa-cyclonon-2,3-ylene; 1,4-diaza-7-oxacyclonon-6,8-ylene; 1,4-diaza-7-oxacyclonon-2,2-ylidene; 1,4-dioxan-2,3-ylene; 1,4-dioxan-2,6-ylene; 1,4-dioxan-2,2-ylidene; tetrahydropyran-2,3-ylene; tetrahydropyran-2,6-ylene; tetrahydropyran-2,5-ylene; tetrahydropyran-2,2-ylidene; 1,4,7-trithiacyclonon-2,3-ylene; 1,4,7-trithia-cyclonon-2,9-ylene; and 1,4,7-trithiacyclonon-2,2-ylidene,
heterocycloalkyl: selected from the group: pyrrolinyl; pyrrolidinyl; morpholinyl; piperidinyl; piperazinyl; hexamethylene imine; 1,4-piperazinyl; tetrahydrothiophenyl; tetrahydrofuranyl; 1,4,7-triazacyclo-nonanyl; 1,4,8,11-tetraazacyclotetradecanyl; 1,4,7,10,13-pentaazacyclopentade-canyl; 1,4-diaza-7-thiacyclononanyl; 1,4-diaza-7-oxacyclo-nonanyl; 1,4,7,10-tetraazacyclododecanyl; 1,4-dioxanyl; 1,4,7-trithiacyclononanyl; tetrahydropyranyl; and oxazolidinyl, where the heterocycloalkyl may be bonded to the compound via any atom in the ring of the selected heterocycloalkyl.

The substituent R may additionally have substituted or unsubstituted heterocycles at any bonding-capable site in its base structure. The substituents may be selected from substituted and unsubstituted heterocycles, for example furan, thiophene, pyrrole, oxazole, thiazole, imidazole, isoxazole, isothiazole, pyrazole, pyridine, pyrazine, pyrimidine, 1,3,6-triazine, pyrylium, alpha-pyrone, gamma-pyrone, benzofuran, benzothiophene, indole, 2H-isoindole, benzothiazole, 2-benzothiophene, 1H-benzimidazole, 1H-benzotriazole, 1,3-benzoxazole, 2-benzofuran, 7H-purine, quinoline, isoquinoline, quinazoline, quinoxaline, phthalazine, 1,2,4-benzotriazine, pyrido[2,3-d]pyrimidine, pyrido[3,2-d]pyrimidine, pteridine, acridine, phenazine, benzo[g]pteridine, 9H-carbazole and bipyridine, and derivatives thereof. Further substitution of R substituents with bulky substituents may lead to further lowering of the sublimation temperatures of the salt-type compound. Moreover, additional substituents can affect the HOMO/LUMO positions.

The electron-conducting layers may include electron transport materials, electron acceptors and organic electron donor compounds.

Electron transport materials to take on electrons and transport them further are known in the related art, and materials may be selected from the group of 2,2',2"-"-(1,3,5-benzenetriyl)tris(1-phenyl-1H-benzimidazole), 2-(4-biphenylyl)-5-(4-tert-butylphenyl)-1,3,4-oxadiazole; 2,9-dimethyl-4,7-diphenyl-1,10-phenanthroline (BCP), 8-hydroxyquinolinolatolithium; 4-(naphthalen-1-yl)-3,5-diphenyl-4H-1,2,4-triazole; 1,3-bis[2-(2,2'-bipyridin-6-yl)-1,3,4-oxadiazol-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazol-2-yl]-2,2'-bipyridyl; 2-phenyl-9,10-di(naphthalen-2-yl)anthracene; 2,7-bis[2-(2,2'-bipyridin-6-yl)-1,3,4-oxadiazol- 5-yl]-9,9-dimethylfluorene; 1,3-bis[2-(4-tert-butylphenyl)-1,3,4-oxadiazol-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyldipyrenylphosphine oxide; naphthalenetetracarboxylic dianhydride or imides thereof; perylenetetracarboxylic dianhydride or imides thereof; materials based on siloles, having a silacyclopentadiene unit or further heterocycles, as described in EP 2 092 041 B1.

The salt-type derivative has one or more anions and cations, where the anion can be derived from phosphoric acid or phosphonic acid in which one or two of the oxygen groups has/have been modified by organic radicals.

The metal cation M may be selected from the group of the alkali metals, alkaline earth metals, main group metals, transition group metals, lanthanoid metals and transition metals. It is desirable to select metals from the abovementioned groups which form stable, singly positively charged cations in salt-type compounds.

Additionally, the metals may be from the first main group of the Periodic Table, the alkali metals. The group of the alkali metals contains the elements Li, Na, K, Rb and Cs. Because of their solubility in the matrix material and the easy evaporability of the salt-type compounds, the alkali metals may be a particular option for formation of n-dopants.

In a particular embodiment, the R radical is bonded to the phosphorus via an oxygen atom.

In a further particular embodiment, the substituents R1 and R2 each bear an organic radical and are each bonded to the phosphorus via an oxygen atom.

In a particular embodiment, the organic electronic component may include a salt-type derivative of a phosphorus oxo compound selected from the group of the phosphoric esters and/or phosphonic esters. The esters of the phosphorus oxo compounds may correspond to the general formula 2

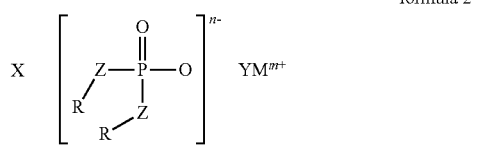

formula 2 or to the general formula 3

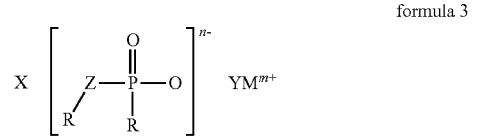

formula 3 with Z=O, S, Se.

The esters of the phosphorus oxo compounds in the form of their phosphoric esters (of formula 2) or phosphonic esters (formula 3) are desirable since, firstly, the HOMO/LUMO distribution of the cation is particularly well matched to the electron transport materials specified in the related art. Secondly, the steric properties of these compounds can contribute to particularly favorable lowering of the sublimation temperature of the salt-type compound. It is thus possible to obtain particularly potent dopants having a particularly low sublimation temperature.

In a particular embodiment, the cation of the salt-type derivative of the phosphorus oxo compound may be selected from the group of the heavy alkali metals cesium and/or rubidium. This selection may be particularly advantageous since the solubility of the heavy alkali metals is better in the matrix material compared to those from the lightweight representatives of the alkali metals. This may lead to a particularly homogeneous distribution within the layer in connection with the anions. In addition, the heavy representatives of the alkali metals can lead to compounds having particularly good evaporability because of the size of the metal cation.

In a particular embodiment, the organic electronic component may be a salt-type derivative of the phosphorus oxo compound having a molecular weight greater than or equal to 70 g/mol and less than or equal to 1000 g/mol, and a sublimation temperature greater than or equal to 120° C. and less than or equal to 1200° C. Without being bound by the theory, this molecular mass range enables a sufficient size of the substituents, in order to disrupt the symmetry of the salt-type compound so as to obtain a lower sublimation temperature. The coulombic interaction between the anions and cations can be reduced in this way. Higher molecular weights may be disadvantageous, in contrast, since the sublimation temperature of the salt-type compound then rises again to a greater than proportional degree as a function of the increase in mass. In the course of processing, it has additionally been found that compounds having sublimation temperatures between greater than or equal to 120° C. and less than or equal to 1200° C. can be deposited from the gas phase in a particularly homogeneous manner. This means that particularly homogeneous layers can be obtained. The molecular weights of the compounds can easily be calculated from the empirical formulae and the sublimation temperatures are determined by the method known in the related art.

In a further aspect, the organic electronic component may include salt-type derivatives of phosphorus oxo compounds selected from the group of the cyclic phosphoric esters and/or phosphonic esters. The cyclic phosphoric or phosphonic esters may be desirable since the relatively rigid cyclic structure is sterically bulky to such an extent that a particularly large lowering of the sublimation temperature of the derivative can be achieved.

In a further embodiment, the organic electronic component may include a salt-type derivative of the phosphorus oxo compounds in a layer thickness concentration of greater than or equal to 0.01% and less than or equal to 50% in the electron-conducting layer. The layer thickness concentration here describes the proportion by volume of the salt-type derivative in the overall electron-conducting layer. This proportion can be calculated, for example, on the basis of the cation distribution within the layer, which is determined, for example, by an energy-dispersive x-ray structure analysis (EDX) or AAS (atomic absorption spectroscopy). In the case that the dopants form charge transfer complexes, the layer thickness concentration can be determined by measurements of the UV absorption.

The properties of an electron-conducting layer can be improved by the addition of a salt-type dopant. The dopant is capable of releasing an electron to the layer and can thus contribute to an increase in the conductivity of the layer. It has been found that, surprisingly, dopant concentrations above and below the above-specified range can lead to poorer conductivities. Without being bound by the theory, lower dopant concentrations lead to inadequate electron injection into the conductive layer, and higher dopant concentrations to a deficiency of electron transport components within the layer. In both cases, the conductivity of the electron-conducting layer is inadequate.

In a further aspect, the derivative of a phosphorus oxo salt may be a cesium or rubidium salt of a compound selected from the group of compounds 6,7,11,12,19,20,24,25-octahydrodibenzo[G,R]-[1,3,6,9,12,14,17,20,2,13]-octaoxadiphosphacyclodocosine-9,22-diol 9,22-dioxide; (4R)-22-hydroxy-5,5-dimethyl-4-phenyl-1,3,2-dioxaphosphorinan 2-oxide; 8,9-diphenyldiphenanthro[4,3-d:3,4-f][1,3,2]dioxaphosphepin-18-ol 18-oxide; 2,6-bis(triphenylsilyl)dinaphtho[2,1-d:1,2-f][1,3,2]dioxaphosphe-pin-4-ol 4-oxide; 1-butyl-3-methylimidazolium dibutylphosphates and corresponding di(C1-C10)alkyl derivatives; diphenyl hydrogenphosphate; bis(4-nitrophenyl) hydrogenphosphate; 2-naphthyl 4-[(E)-phenyldiazenyl]phenylhydrogenphosphate; dinaphtho[2,1-d:1,2-f][1,3,2]dioxaphosphepin-4-ol 4-oxide; (R)-3,3'-bis[3,5-bis(trifluoromethyl)phenyl]-1,1'-binaphthyl-2,2'-diyl hydrogenphosphate; (S)-3,3'-bis(2,4,6-triisopropyl-phenyl)-1,1'-binaphthyl-2,2'-diyl hydrogenphosphate; 18-hydroxy-8,9-diphenyldiphenanthro[4,3-d:3',4'-f][1,3,2]-dioxa-phosphepin 18-oxide; (IIbR)-4-hydroxy-2,6-bis(triphenylsilyl)-dinaphtho-[2,1-d:1',2'f]-1,3,2-dioxaphosphepin 4-oxide; (R)-(−)-3,3'-bis(triphenylsilyl)-1,1'-binaphthyl-2,2'-diyl hydrogenphosphate; lithium carbamoylphosphate; D-myo-inositol 1-monophosphate; 6-benzoyl-2-naphthyl phosphate; 4-nitrophenyl phosphate bis(cyclohexylammonium) salt; Naphthol AS phosphate; Naphthol AS-MX phosphate; 4-(tert-pentyl)phenyl phosphate; geranylgeranyl pyrophosphate; Naphthol AS phosphate; methyl phosphonate; trichloromethyl phosphonate; heptane-1,7-diyl diphosphonate; (heptylsulfanyl)methyl phosphonate; 1-hydroxybutyl phosphonate; 2-phenylethyl phosphonate; butylhydrogentrichloromethyl phosphonate; 4-methoxyphenyl phosphonate; 3-phenylpropyl phosphonate; dimethylallyl phosphonate; 1-aminopentane-1,1-diyl diphosphonate; 4-iodobenzyl phosphonate; ((2-cyanoethyl)-phosphonomethylamino)-acetate; 4-ethoxyphenyl phosphonate; (+−)-2-amino-4-phosphonobutanate; glyphosate 3-13C[(phosphonomethyl)amino]-acetate; amino(phenyl)methyl phosphonate; 3-(carboxymethyl-phosphonomethyl-amino)propionate; D-(−)-2-amino-5-phosphono-pentanate; 2-amino-7-phosphonoheptanate; tetramethyl 2-oxopropane-1,3-diyl diphosphonate; 2-methoxybenzyl phosphonate; tetraethylmethylene diphosphonate; diethyl methoxymethylphosphonate; methyl 6-[hydroxy(isopropoxy)phosphoryl]-hexanoate; ((2-cyanoethyl)(hydroxymethoxyphosphorylmethyl)-amino)acetate; dipropylchloromethylphosphonate; amino[4-(trifluoromethyl)phenyl]methylphosphonate; [(4-chlorobenzyl)-amino]methylphosphonate.

The compounds listed form part of the group of the phosphoric and phosphonic salts and may lead, by virtue of their steric structure and their valence properties, to advantageous HOMO/LUMO combinations between the electron-conducting layer material and the anion of the dopant. This can contribute to increased electron injection of the dopant and, as a result, to higher conductivities of the electron-conducting layer.

Additionally, the cations from the above-listed group of phosphorus oxo compounds may be selected from the group of sodium, potassium, cesium or rubidium.

Additionally a process for producing an organic electronic component includes a) providing a substrate carrier with a first electrode,
b) applying at least one electron-conducting layer including a derivative of a phosphorus oxo salt and an organic matrix material to the first electrode and
c) applying a second electrode in electrically conductive contact with the electron-conducting layer,
wherein the application of the electron-conducting layer in (b) is effected by a solvent or evaporation process.

In a particular embodiment, the process can be utilized in order to apply an intermediate layer to a cathode of an organic electronic component.

In (b), the electron-conducting region may be produced by gas phase deposition, e.g., by physical gas phase deposition (PVD). In way, the dopant can be deposited together with the electron-conducting layer. By this process, particularly homogeneous and uniform layers are obtained. Solvent processes in (b) can be conducted in such a way that the components of the electron-conducting layer and the dopant are deposited from an anhydrous solvent onto a substrate.

In a process for producing an organic electronic component, the phosphorus oxo salts, prior to application, have a water content of greater than or equal to 0% by weight and less than or equal to 0.25% by weight. The phosphorus oxo salt, prior to application, may have a water content of 0% by weight. A phosphorus oxo salt having a water content of 0% by weight also includes phosphorus oxo salts having traces of water below the detection limit. The water content can be determined by the standard methods known to those skilled in the art. At this point, mention should be made of moisture determination according to Karl Fischer.

In a further configuration, in the process for producing an organic electronic component, the electron-conducting layer may be applied in (b) by spin-coating, slot-coating, printing or knife-coating. These processes may be used for reproducible production of homogeneous layers having high spatial resolution. Specifically in the wet process, it is possible by virtue of the improved solubility of the compounds to obtain very homogeneous layers.

In a further configuration, the organic electronic component may be disposed within an organic solar cell, an organic transistor, a light-emitting organic component, an organic light-emitting diode and/or an organic light-emitting electrochemical cell.

Figure 2:
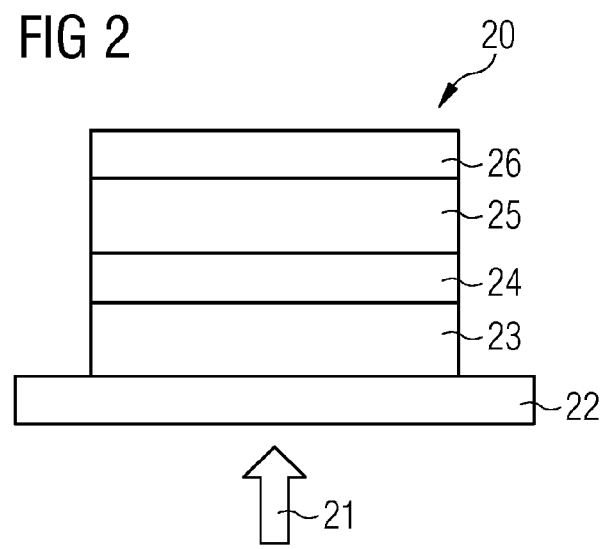
FIG. 2 is a schematic of the structure of an organic solar cell.
Figure 3:
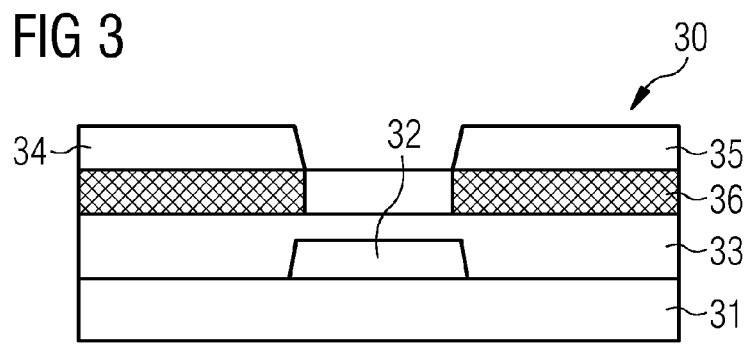
FIG. 3 a schematic cross section of an organic field-effect transistor.

The structure of organic electronic components is elucidated in detail hereinafter by figures. The figures show:

FIG. 1 a schematic of the structure of an organic light-emitting diode (10). The light-emitting diode is formed from a glass layer (1); indium tin oxide (ITO) layer (2); hole injector layer (3); hole transport layer (HTL) (4); emitter layer (EML) (5); hole blocker layer (HBL) (6); electron transport layer (ETL) (7); electron injector layer (8) and a cathode layer (9);

FIG. 2 a schematic of the structure of an organic solar cell having PIN structure (20), which converts light (21) to electrical current. The solar cell has a layer of indium tin oxide (22); a p-doped layer (23); an absorption layer (24); an n-doped layer (25) and a metal layer (26);

FIG. 3 a schematic of a possible cross section of an organic field-effect transistor (30). Applied to a substrate (31) are a gate electrode (32), a gate dielectric (33), a source and drain contact (34+35) and an organic semiconductor (36). The hatched areas show the points where contact doping is helpful.

Examples

I) Production of the Comparative Material

Deposited on an ITO (indium tin oxide=indium-doped tin oxide) electrode by thermal evaporation is a 200 nm-thick layer of the electron conductor BCP (2,9-dimethyl-4,7-diphenyl-1,10-phenanthroline). The counterelectrode used is a 150 nm-thick aluminum layer.

II. Production of Organic Electrically Conductive Layers Including a Phosphoric Acid Derivative In three further experiments, dicesium phenyl phosphate is incorporated by doping in concentrations of 2% by weight, 5% by weight and 10% by weight relative to the evaporation rate of BCP (2,9-dimethyl-4,7-diphenyl-1,10-phenanthroline).

In the course of a physical characterization, the result obtained for the current-voltage characteristics of the doped organic components is that the current density of the doped layers is well above that of the comparative substrate at the same voltage. This effect is nearly proportional to the doping strength, at least in the lower concentration range. Increasing current density thus leads to the conclusion of an increase in charge carrier density and/or mobility.

III. Production of Organic Electrically Conductive Layers Including a Phosphonic Acid Derivative in Three Further Experiments, Dicesium Decyl Phosphonate is Incorporated by Doping in Concentrations of 2% by Weight, 5% by Weight and 10% by Weight Relative to the Evaporation Rate of BCP (2,9-dimethyl-4,7-diphenyl-1,10-phenanthroline)

In the course of a physical characterization, the result obtained for the current-voltage characteristics of the doped organic components is that the current density of the doped layers is well above that of the comparative substrate at the same voltage. This effect is nearly proportional to the doping strength. Increasing current density thus leads to the conclusion of an increase in charge carrier density and/or mobility.

Even though the invention has been illustrated in detail and described by a working example, the invention is not restricted by the examples disclosed, and other variations may be derived therefrom by the person skilled in the art without leaving the scope of protection of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. An organic electronic component comprising: a substrate; first and second electrodes; and at least one electron-conducting layer, disposed between the first and second electrodes, including a salt-type derivative of a phosphorus oxo compound having an n-dopant as follows

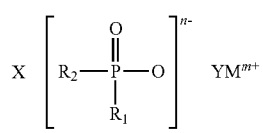

where X, Y are greater than 0 and not greater than 3; n, m are integers greater than 0 and less than 4; M is a metal and $R_1=O_1$, S, Se, O—R, S—R, Se—R and R2=R, O—R, S—R, Se—R, and R is selected from the group consisting of substituted and unsubstituted alkyl, long-chain alkyl, cycloalkyl, haloalkyl, aryl, arylene, haloaryl, heteroaryl, heteroarylene, heterocycloalkylene, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl; and wherein the salt-type derivative of a phosphorus oxo salt is one of a cesium salt and a rubidium salt of a compound selected from the group consisting of: 6,7,11,12,19,20,24,25-octahydrodibenzo[g,r]-[1,3,6,9,12,14,17,20,2,13]-octaoxadiphosphacyclodocosine-9,22-diol 9,22-dioxide: (4R)-22-hydroxy-5,5-dimethyl-4-phenyl-1,3,2-dioxaphosphorinan 2-oxide; 8,9-diphenyldiphenanthro[4,3-d:3,4-f][1,3,2]dioxaphosphepin-18-ol 18-oxide; 2,6-bis(triphenylsiyl)dinaphtho[2,1-d:1,2-f][1,3,2]dioxaphosphepin-4-ol 4-oxide; 1-butyl-3-methylimidazolium dibutylphosphate and corresponding di(C1-C10)alkyl derivatives; diphenyl hydrogenphosphate; bis(4-nitrophenyl)hydrogenphosphate; 2-naphthyl 4-[(E)-phenyldiazenyl]phenylhydrogenphosphate; dinaphtho[2,1-d:1,2-f][1,3,2]dioxaphosphepin-4-ol 4-oxide; (R)-3,3'-bis[3,5-bis(trifluoromethyl)phenyl]-1,1'-binaphthyl-2,2'-diylhydrogenphosphate; (S)-3,3'-bis(2,4,6-triisopropyl-phenyl)-1,1'-binaphthyl-2,2'-diylhydrogenphosphate; 18-hydroxy-8,9-diphenyldiphenanthro[4,3-d:3',4'-f][1,3,2]-dioxaphosphepin 18-oxide; (IIbR)-4-hydroxy-2,6-bis(triphenylsilyl)dinaphtho-[2,1-d:1',2'f]-1,3,2-dioxaphosphepin 4-oxide; (R)-(−)-3,3'-bis(triphenylsilyl)-1,1'-binaphthyl-2,2'-diyl hydrogenphosphate; lithium carbamoylphosphate; D-myo-inositol 1-monophosphate; 6-benzoyl-2-naphthyl phosphate; 4-nitrophenyl phosphate bis(cyclohexylammonium) salt; Naphthol AS phosphate; Naphthol AS-X phosphate; 4-tert-pentyl)phenyl phosphate; geranylgeranyl pyrophosphate; Naphthol AS phosphate; methyl phosphonate; trichloromethyl phosphonate; heptane-1,7-diyldiphosphonate; (heptylsulfanyl)methyl phosphonate; 1-hydroxybutyl phosphonate; 2-phenylethyl phosphonate; butylhydrogentrichloromethyl phosphonate; 4-methoxyphenyl phosphonate; 3-phenylpropyl phosphonate; dimethylallyl phosphonate; 1-aminopentane-1,1-diyl diphosphonate; 4-iodobenzyl phosphonate; ((2-cyanoethyl)-phosphonomethylamino)acetate; 4-ethoxyphenyl phosphonate; (+−)-2-amino-4-phosphonobutanate; glyphosate 3-13C [(phosphonomethyl)amino]acetate; amino(phenyl)methyl phosphonate; 3-(carboxymethylphosphonomethylamino)-propionate; D-(−)-2-amino-5-phosphonopentanate; 2-amino-7-phosphonoheptanate; tetramethyl 2-oxopropane-1,3-diyl diphosphonate; 2-methoxybenzyl phosphonate; tetraethylmethylene diphosphonate; diethyl methoxymethyl-phosphonate; methyl 6-[hydroxy(isopropoxy)phosphoryl]-hexanoate; ((2-cyanoethyl)(hydroxymethoxyphosphoryl-methyl)amino)acetate; dipropylchloromethylphosphonate; amino[4-(trifluoromethyl)phenyl]methylphosphonate; and [(4-chlorobenzyl)amino]methylphosphonate.

2. The organic electronic component as claimed in claim 1, wherein the salt-type derivative of the phosphorus oxo compounds is present in the electron-conducting layer in a layer thickness concentration of at least 0.01% and not greater than 50%.

3. The organic electronic component as claimed in claim 1, wherein the salt-type derivative of the phosphorus oxo compound has a molecular weight of at least 70 g/mol and not greater than 1000 g/mol, and a sublimation temperature of at least 120° C. and not greater than 1200° C.

4. The organic electronic component as claimed in claim 1, wherein the salt-type derivative of the phosphorus oxo compounds is present in the electron-conducting layer in a layer thickness concentration of at least 0.01% and not greater than 50%.

5. The organic electronic component as claimed in claim 1, wherein the organic electronic component is disposed within one of an organic solar cell, an organic transistor, a light-emitting organic component, an organic light-emitting diode and an organic light-emitting electrochemical cell.

* * * * *